United States Patent
Nguyen et al.

(10) Patent No.: US 7,572,735 B2
(45) Date of Patent: Aug. 11, 2009

(54) BLANKET RESIST TO PROTECT ACTIVE SIDE OF SEMICONDUCTOR

(75) Inventors: Scott Cuong Nguyen, Garland, TX (US); Keith David Fenstermacher, Murphy, TX (US); David Michael Smith, Plano, TX (US); Courtney Michael Hazelton, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 456 days.

(21) Appl. No.: 11/528,255

(22) Filed: Sep. 27, 2006

(65) Prior Publication Data

US 2008/0076254 A1    Mar. 27, 2008

(51) Int. Cl.
*H01L 21/311*    (2006.01)
(52) U.S. Cl. ............... 438/703; 438/216; 438/591; 438/745; 257/E21.487

(58) Field of Classification Search ............ 438/216, 438/287, 591, 703, 745; 430/317; 257/E21.487
See application file for complete search history.

(56) References Cited

U.S. PATENT DOCUMENTS

2002/0064960 A1*  5/2002  Hoepfner ............... 438/697

\* cited by examiner

*Primary Examiner*—Thanhha Pham
(74) *Attorney, Agent, or Firm*—Wade J. Brady, III; Frederick J. Telecky, Jr.

(57) ABSTRACT

Yield loss in semiconductor processing is mitigated by forming a resist over an active side of a semiconductor workpiece or wafer, as well as around the edge of the wafer. The resist mitigates the creation of contaminants, such as nitride flakes, for example, that can develop when an oxide, nitride, oxide (ONO) layer is removed from the back or in-active side of the wafer. In the absence of the resist, such flakes may migrate to the front or active side of the wafer and cause defects to form therein, which can result in yield loss.

20 Claims, 4 Drawing Sheets

BLANKET RESIST TO PROTECT ACTIVE SIDE OF SEMICONDUCTOR

FIELD OF INVENTION

The present invention relates generally to semiconductor processing, and more particularly to forming a resist over one side of a semiconductor wafer or workpiece to protect that side of the wafer while that other side of the wafer is processed.

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The disclosure herein pertains to mitigating yield loss in semiconductor processing. A resist is formed over an active side of a semiconductor workpiece or wafer, as well as around the edge of the wafer. The resist mitigates the formation of contaminants, such as nitride flakes, for example, that can develop when an oxide, nitride, oxide (ONO) layer is removed from the back or in-active side of the wafer. In the absence of the resist, such flakes may migrate to the front or active side of the wafer and cause defects to form therein, resulting in yield loss.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 5 is a cross-sectional view of a semiconductor substrate in the process of having an ONO layer removed from a back side there-of.

DETAILED DESCRIPTION OF THE INVENTION

Figure 1:
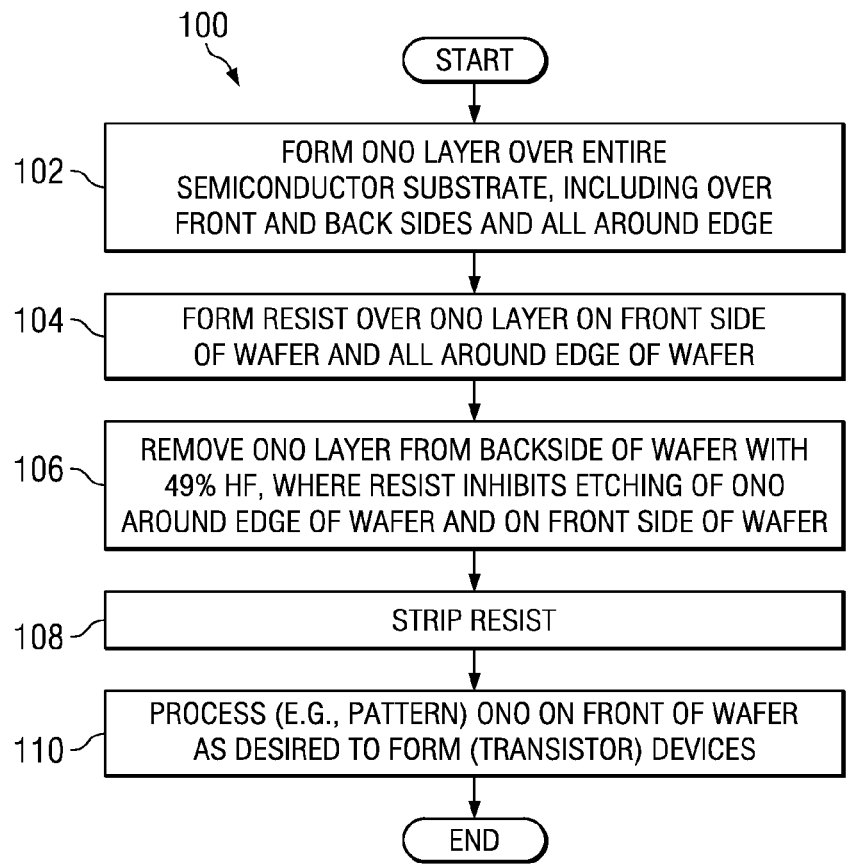
FIG. 1 is a flow diagram illustrating an exemplary methodology for mitigating yield loss in semiconductor processing as described herein.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

A methodology 100 is illustrated in FIG. 1 for mitigating yield loss in semiconductor fabrication, and FIGS. 2-6 are cross sectional views of a semiconductor substrate 200 whereon such a method is applied. While the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Figure 2:
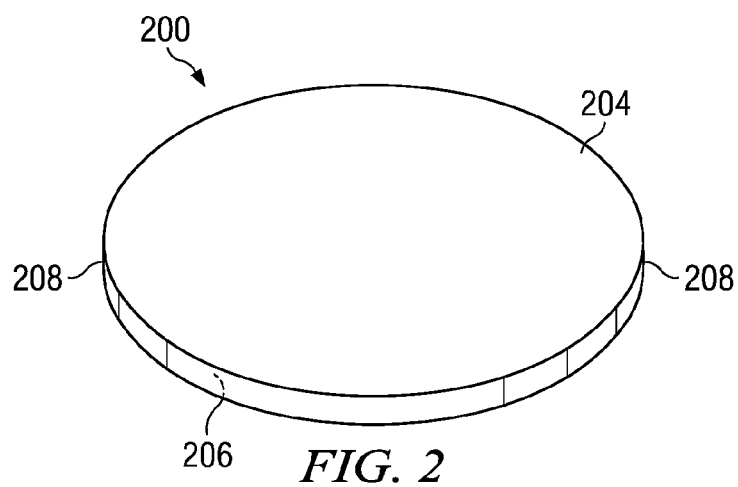
FIG. 2 is a perspective view of a semiconductor wafer or workpiece.
Figure 3:
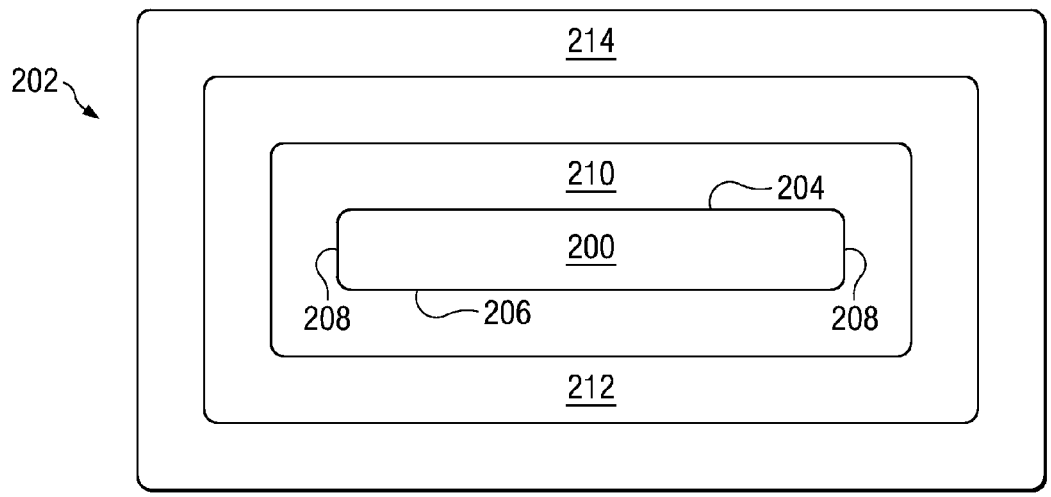
FIG. 3 is a cross-sectional view of a semiconductor substrate having an ONO layer formed there-around.

At the outset, a layer of oxide, nitride, oxide (ONO) material 202 is formed all around the wafer 200 at 102 (FIG. 3). More particularly, the layer of ONO material 202 is formed all over both the backside 204 and the front side 206 of the wafer 200, as well as all around the edge 208 of the wafer 200 (FIGS. 2 & 3). It will be appreciated that the layer of ONO material 202 comprises a first layer of oxide based material 210 in contact with the wafer 200, a layer of nitride based material 212 formed over the first layer of oxide based material 210 and a second layer of oxide based material 214 formed over the layer of nitride based material 212. The layers 210, 212, 214 of the ONO layer 202, as with all layers described herein, can be formed in any suitable manner, such as with spin on, sputtering, growth and/or deposition techniques, etc.

Figure 4:
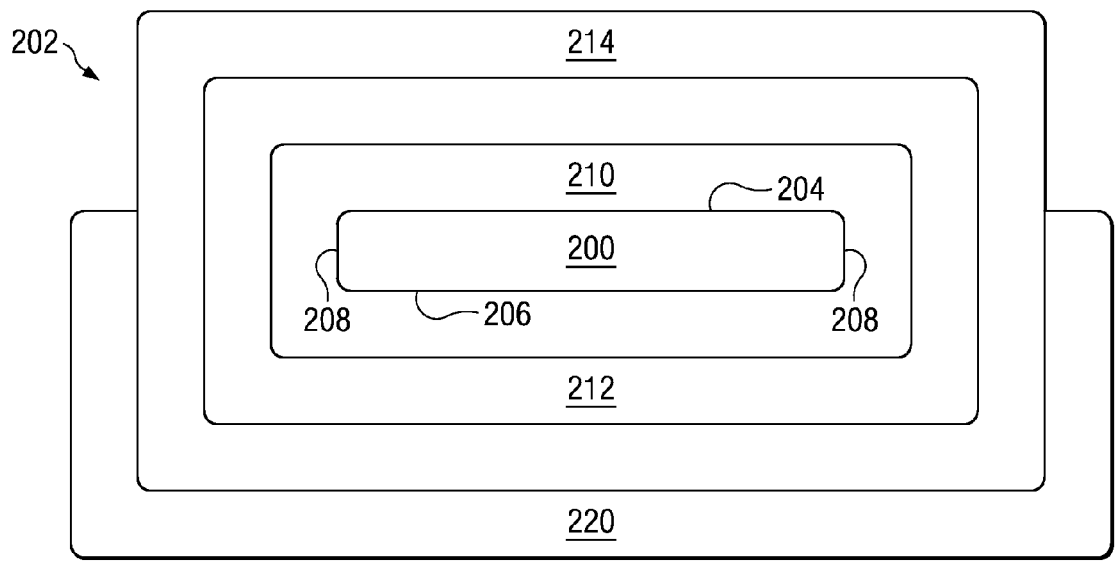
FIG. 4 is a cross-sectional view of a semiconductor substrate with a resist formed over an active side thereof.

A layer of resist material 220 is then formed over the front side 206 of the wafer 200 as well as all around the edge 208 of the wafer 200 at 104 (FIG. 4). More particularly, the resist 220 extends over about one half of the edge 208 of the wafer 200. The resist material 220 is a light sensitive material and generally comprises carbon. The resist material 220 may be formed to a thickness of between about 0.5 micrometers and about 1.5 micrometers, for example. It will be appreciated that the front side 206 of the wafer 200 is referred to as an active side of the wafer 200 or as comprising active regions. This designation is based upon the fact that semiconductor devices and/or circuitry will eventually be formed on the front side 206 of the wafer 200, as opposed to on the back or in-active side 204 of the wafer 200 whereon no such features will be formed. It will also be appreciated that the wafer 200 is illustrated as being "upside down" or rather as having the back side 204 facing up and the front side 206 facing down in FIGS. 2-7 because this generally corresponds to the orientation of wafers in relevant processing equipment.

Figure 5:
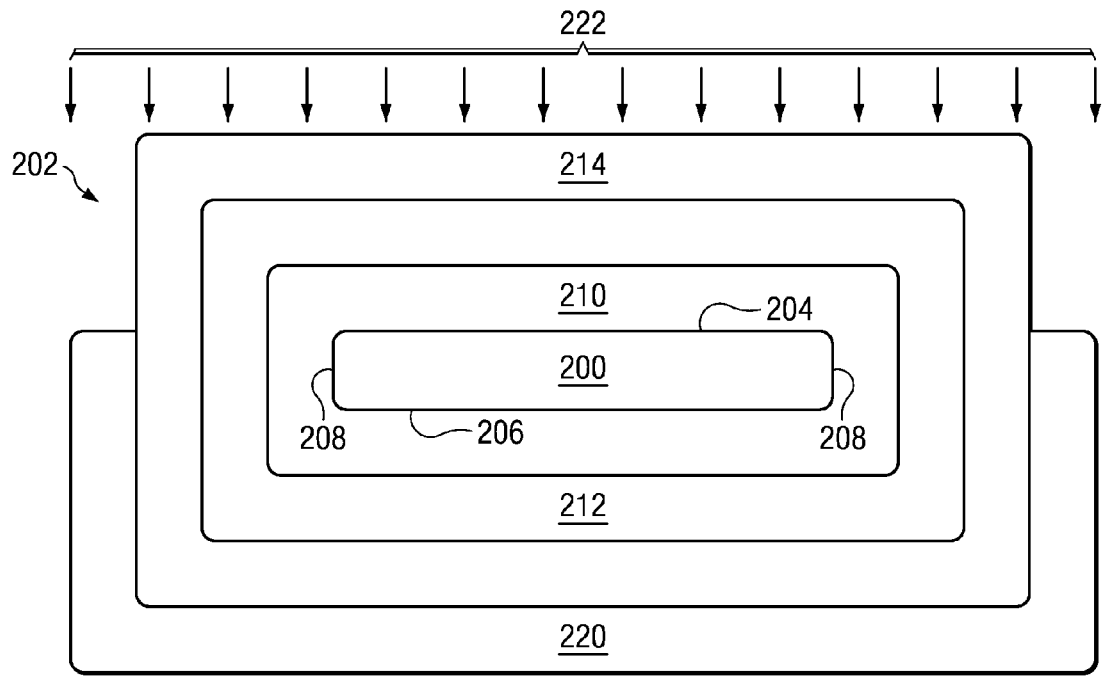
Figure 6:
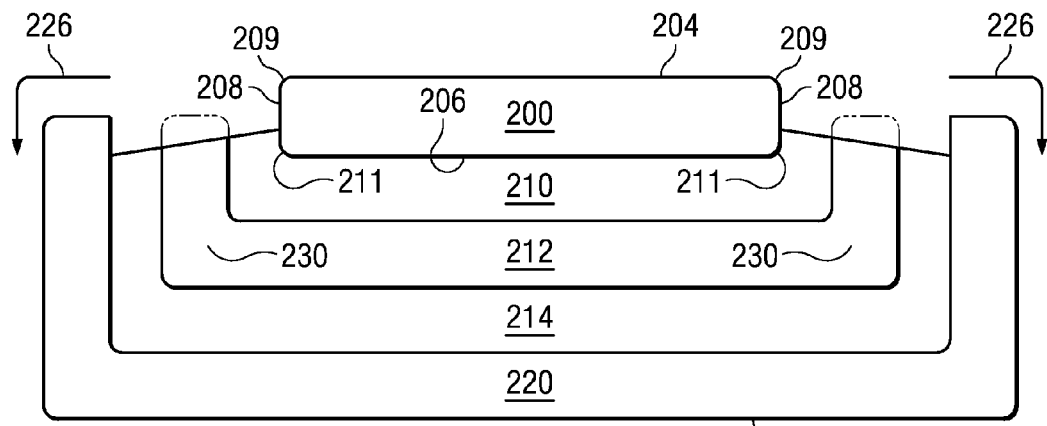
FIG. 6 is a cross-sectional view of a semiconductor substrate with an ONO layer removed from a back side thereof.

With the protective resist 220 in place, the layer of ONO material 202 is removed from the back or in-active side 204 of the wafer 200 at 106 (FIG. 5). In one example, a composition (e.g., solution) that is about 49% Hydrofluoric acid (HF) is applied 222 (e.g., spun on) to the back side 204 of the wafer 200. Importantly, should any of the etchant solution run 226 around to the front side 228 of the resist 220, the substantially insoluble nature of the resist 220 (at least with regard to this composition) impedes etching of the ONO layer 202 on the front side 206 of the wafer 200. The composition does, however, etch through exposed portions of the ONO layer 202 on the back side 204 of the wafer 200 as well as on the exposed half 209 of the edge 208 of the wafer 200, leaving ONO 202 merely on the front side 206 and the un-exposed lower half 211 of the edge 208 of the wafer 200 (FIG. 6).

It will be appreciated, however, that the etchant solution may "wick" its way between the resist 220 and the covered lower half 211 of the edge 208 of the wafer 200, and onto ONO extending from the front or active side 206 of the wafer 200. However, it will also be appreciated that FIG. 6 is not drawn to scale and that the separation between the resist 220 and the edge 208 is much smaller than that illustrated. Accordingly, the etchant solution may not advance easily as it wicks/etches between these features. As such not all of the ONO on the un-exposed lower half 211 of the edge 208 of the wafer 200 may be consumed by the wicking etchant.

Nevertheless, it will be appreciated that the etchant composition etches oxide and nitride at different rates. Accordingly, the first 210 and second 214 layers of oxide based material may be removed faster than the layer of nitride based material 212. As such, it's possible that some "undercutting" may occur around the edge 208 of the wafer 200, and more particularly around the un-exposed lower half 211 of the edge 208 of the wafer 200. Accordingly, a bit 230 (illustrated in phantom) of nitride based material may protrude out from the first 210 and second 214 layers of oxide based material due to the different etch rates between oxide and nitride based materials. In any event, removing the ONO layer 202 from the back side 204 of the wafer 200 as described herein results in little to no yield loss (as compared to in the absence of the protective resist 220). As such, should some nitride based material 230 stick out around the edge 208 of the wafer 200, this does not promote yield loss. It may be concluded that if such "protruding" nitride based material 230 does exist, that it does not flake off, is too small to result in yield loss if it does flake off, does not make its way onto the active side 206 of the wafer if it does flake off (e.g., due to the presence of the resist 220) and/or is removed along with the resist if it does flake off (with little to no effect on the active side 206 of the wafer 200).

Figure 7:
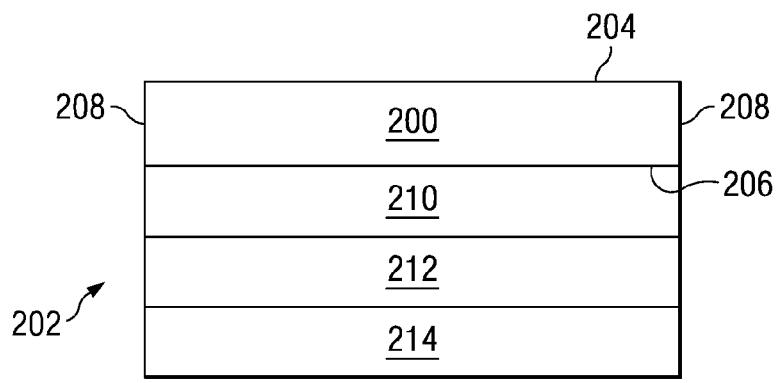
FIG. 7 is a cross-sectional view of a semiconductor substrate after a protective resist formed over the active side thereof has been removed.
Figure 8:
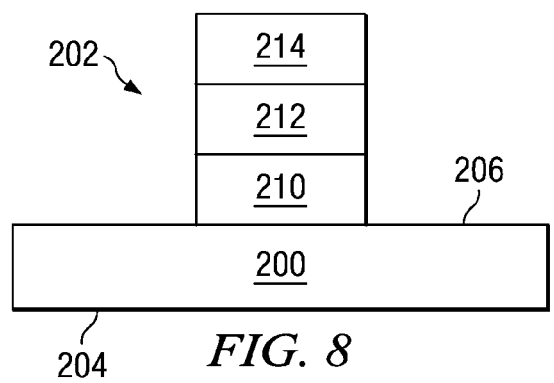
FIG. 8 is a cross-sectional view of a semiconductor substrate after an ONO layer thereon has been patterned.

At 108, the resist 220 is thus removed from the front or active side 206 of the wafer 200, where nitride based flakes 230 (if any exist) may also be removed along with the resist 220 (FIG. 7). The resist 220 may be removed, for example, with ozonated sulfuric acid (H2SO4), but in the absence of Hydrofluoric acid HF. Once the resist 220 is removed, the ONO layer 202 on the front side 204 of the wafer 200 is then processed as desired for device/circuit development at 110 (FIG. 8—wherein the wafer is no longer "upside down"). In the illustrated example, the ONO layer 202 is patterned to form part of a transistor gate structure. Generally speaking, to establish any transistor, a gate structure and source and drain regions are formed after which silicide, metallization, and/or other back-end processing can be performed.

In the illustrated example, the patterned ONO layer 202 may serve as a dielectric or charge trapping layer of the gate structure. A gate layer (e.g., of polysilicon or other conductive material) is then deposited and patterned over the patterned ONO layer 202. The polysilicon layer can, for example, be formed to a thickness of between about 500 Angstroms and about 5000 Angstroms, and may include a dopant, such as a p-type dopant (Boron) or n-type dopant (e.g., Phosphorus), depending upon the type(s) of transistors to be formed. The dopant can be in the polysilicon as originally applied, or may be subsequently added thereto (e.g., via a doping process). It will be appreciated that the ONO layer 202 and gate polysilicon layer may be patterned concurrently.

With the patterned gate structure formed, LDD, MDD, or other extension implants can be performed, for example, depending upon the type(s) of transistors to be formed, and left and right sidewall spacers can be formed along left and right lateral sidewalls of the patterned gate structure. Implants to form the source (S) region and the drain (D) region are then performed, wherein any suitable masks and implantation processes may be used in forming the source and drain regions to achieve desired transistor types. For example, a PMOS source/drain mask may be utilized to define one or more openings through which a p-type source/drain implant (e.g., Boron (B and/or BF$_2$)) is performed to form p-type source and drain regions for PMOS transistor devices. Similarly, an NMOS source/drain mask may be employed to define one or more openings through which an n-type source/drain implant (e.g., Phosphorous (P) and/or Arsenic (As)) is performed to form n-type source and drain regions for NMOS transistor devices. Depending upon the types of masking techniques employed, such implants may also selectively dope the polysilicon of the gate structure of certain transistors, as desired. It will be appreciated that a channel region is defined in the semiconductor substrate under the gate structure and between the source and drain regions.

It will be appreciated that all masking and/or patterning mentioned herein can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Additionally, substrate or semiconductor substrate as used herein may comprise any type of semiconductor body (e.g., silicon, SiGe, SOI) such as a semiconductor wafer or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-8 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of mitigating yield loss in semiconductor fabrication, comprising:
    forming a layer of oxide, nitride, oxide (ONO) material over the back and front sides of a semiconductor substrate, and around the edge of the semiconductor substrate;
    forming a resist over the front side and around the edge of the semiconductor substrate;
    removing the layer of ONO material from the back side of the semiconductor substrate; and
    removing the resist from the front side of the semiconductor substrate, revealing the ONO on the front side of the semiconductor substrate.

2. The method of claim 1, the ONO material removed with a composition of about 49% Hydrofluoric acid (HF).

3. The method of claim 1, the resist removed with ozonated sulfuric acid (H2SO4) in the absence of Hydrofluoric acid (HF).

4. The method of claim 2, the resist removed with ozonated sulfuric acid (H2SO4) in the absence of Hydrofluoric acid (HF).

5. The method of claim 1, the resist comprising carbon.

6. The method of claim 2, the resist comprising carbon.

7. The method of claim 3, the resist comprising carbon.

8. The method of claim 4, the resist comprising carbon.

9. The method of claim 1, the resist formed to a thickness of between about 0.5 micrometers and about 1.5 micrometers.

10. The method of claim 2, the resist formed to a thickness of between about 0.5 micrometers and about 1.5 micrometers.

11. The method of claim 3, the resist formed to a thickness of between about 0.5 micrometers and about 1.5 micrometers.

12. The method of claim 4, the resist formed to a thickness of between about 0.5 micrometers and about 1.5 micrometers.

13. The method of claim 5, the resist formed to a thickness of between about 0.5 micrometers and about 1.5 micrometers.

14. The method of claim 1, further comprising:
    patterning the ONO on the front side of the semiconductor substrate to serve as part of a transistor.

15. The method of claim 13, further comprising:
    patterning the ONO on the front side of the semiconductor substrate to serve as part of a transistor.

16. The method of claim 1, the resist formed around about one half of the edge of the semiconductor substrate.

17. The method of claim 2, the resist formed around about one half of the edge of the semiconductor substrate.

18. The method of claim 4, the resist formed around about one half of the edge of the semiconductor substrate.

19. The method of claim 8, the resist formed around about one half of the edge of the semiconductor substrate.

20. The method of claim 15, the resist formed around about one half of the edge of the semiconductor substrate.

* * * * *